(12) United States Patent
Haglan

(10) Patent No.: US 7,447,272 B2
(45) Date of Patent: Nov. 4, 2008

(54) FILTER METHOD AND APPARATUS FOR POLAR MODULATION

(75) Inventor: David E. Haglan, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 563 days.

(21) Appl. No.: 10/420,321

(22) Filed: Apr. 22, 2003

(65) Prior Publication Data

US 2004/0212445 A1    Oct. 28, 2004

(51) Int. Cl.
H04L 27/04 (2006.01)
(52) U.S. Cl. ..................................... 375/295
(58) Field of Classification Search ................. 375/295, 375/297, 298; 330/10; 348/442; 332/145; 704/211; 455/126
See application file for complete search history.

(56) References Cited

U.S. PATENT DOCUMENTS

| 5,847,602 | A | * | 12/1998 | Su ............................... 330/10 |
| 5,952,895 | A | | 9/1999 | McCune, Jr. et al. ........ 332/128 |
| 6,094,101 | A | | 7/2000 | Sander et al. ................. 331/17 |
| 6,101,224 | A | * | 8/2000 | Lindoff et al. ............... 375/300 |
| 6,112,071 | A | | 8/2000 | McCune, Jr. ................. 455/337 |
| 6,140,882 | A | | 10/2000 | Sander ........................ 331/25 |
| 6,198,347 | B1 | | 3/2001 | Sander et al. ................. 330/251 |
| 6,215,355 | B1 | | 4/2001 | Meck et al. .................... 330/51 |
| 6,219,394 | B1 | | 4/2001 | Sander ......................... 375/355 |
| 6,701,134 | B1 | * | 3/2004 | Epperson ..................... 455/102 |
| 6,834,084 | B2 | * | 12/2004 | Hietala ........................ 375/296 |
| 7,020,070 | B2 | * | 3/2006 | Lindoff ....................... 370/206 |
| 7,062,236 | B2 | * | 6/2006 | Midtgaard et al. .......... 455/126 |
| 2003/0158729 | A1 | * | 8/2003 | Royle et al. ................. 704/211 |
| 2003/0227342 | A1 | * | 12/2003 | Liu ............................ 332/145 |
| 2005/0074073 | A1 | * | 4/2005 | Yuan et al. .................. 375/268 |

OTHER PUBLICATIONS

Heimbach, "Polarizing RF transmitters for multimode operation." *Communication Systems Design*, CMP Media LLC, Oct. 2001.
McCune, "Polar Modulation: an alternative for software defined radio," *International Symposium on Advanced Radio Technologies*, Boulder, CO, Mar. 6, 2002.

* cited by examiner

*Primary Examiner*—Don N Vo
(74) *Attorney, Agent, or Firm*—Fulbright & Jaworski, LLP

(57) ABSTRACT

A method includes providing an in-phase signal and a quadrature-phase signal (I/Q signals), processing the in-phase and quadrature phase signals to produce a magnitude signal and a phase signal, conditioning the phase signal to produce a conditioned phase signal, filtering the magnitude signal to produce a filtered magnitude signal, and amplifying the conditioned phase signal as a function of the filtered magnitude signal to produce a polar modulated signal. An apparatus includes a pair of I/Q channels, an I/Q to magnitude/phase circuit coupled to the pair of I/Q channels, a magnitude conditioning circuit coupled to the I/Q to magnitude/phase circuit; the magnitude conditioning circuit embodying a magnitude filter; a phase conditioning circuit coupled to the I/Q to magnitude/phase circuit, and an amplifier circuit coupled to the magnitude conditioning circuit and the phase conditioning circuit.

25 Claims, 5 Drawing Sheets

FILTER METHOD AND APPARATUS FOR POLAR MODULATION

BACKGROUND OF THE INVENTION

1. Field of the Invention

The invention relates generally to the field of communications. More particularly, the invention relates to a polar modulator.

2. Discussion of the Related Art

The cellular communication industry has been striving to create networks that allow consumers to use their services anywhere. Designing RF front ends for multimode telephones and base stations has been a difficult task, however, polar modulation technology has been developed to facilitate the design of such systems.

A polar modulator can independently process a carrier's amplitude and phase signals, typically working together with a nonlinear power amplifier operating in switched mode. The elimination of the linear operation requirement enables the power amplifier efficiency to be maximized for each modulation standard.

Under a polar modulation scheme, multimode operation may be achieved by digital switching. Phase information is used to tune a voltage-controlled oscillator (VCO) driving the power amplifier, while amplitude information modulates the power amplifier according to the standard required.

Unfortunately, polar modulator transmitters do not always meet signal quality specifications determined by current industry standards. What is needed is a method and apparatus for improving signal quality in a polar modulation system.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those of ordinary skill in the art from this disclosure.

According to an aspect of the invention, a method includes providing an in-phase signal and a quadrature-phase signal, processing the in-phase and quadrature phase signals to produce a magnitude signal and a phase signal, conditioning the phase signal to produce a conditioned phase signal, filtering the magnitude signal to produce a filtered magnitude signal, and amplifying the conditioned phase signal as a function of the filtered magnitude signal to produce a polar modulated signal.

According to another aspect of the invention, an apparatus includes a pair of I/Q channels, an I/Q to magnitude/phase circuit coupled to the pair of I/Q channels, a magnitude conditioning circuit coupled to the I/Q to magnitude/phase circuit, the magnitude conditioning circuit embodying a magnitude filter, a phase conditioning circuit coupled to the I/Q to magnitude/phase circuit, and an amplifier circuit coupled to the magnitude conditioning circuit and the phase conditioning circuit.

Figure 1:
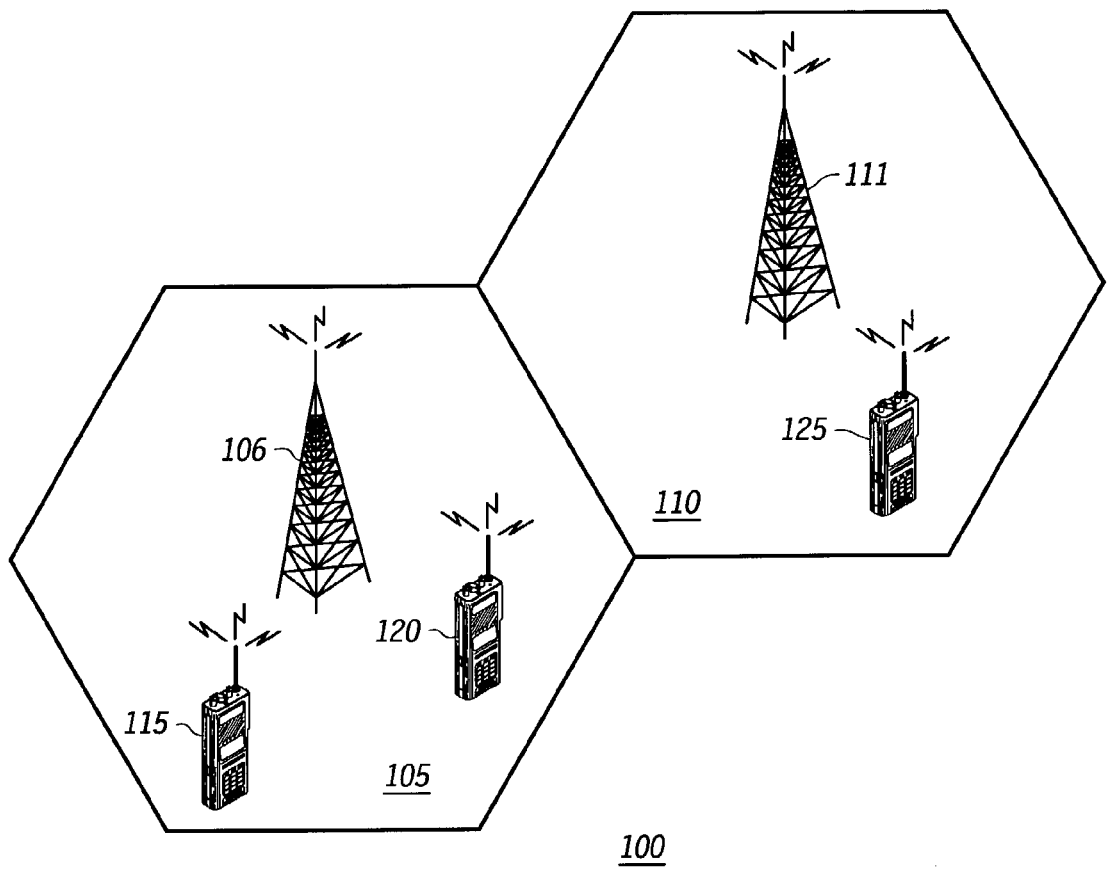
FIG. 1 is a diagram of a plurality of wireless devices operating in a multimode environment, representing an embodiment of the invention.

Referring to FIG. 1, a diagram of a plurality of wireless devices 115-125 operating in a multimode environment 100 is depicted according to an exemplary embodiment of the invention. A first coverage area 105 may comprise a first antenna 106, and a second coverage area 110 may comprise a second antenna 111. Each of the areas 105, 110 may operate within a different wireless standard (mode) such as, for example, Global System for Mobile Communications (GSM), Enhanced Data Rates for GSM Evolution (EDGE) or Wideband Code Division Multiple Access (W-CDMA).

In order for wireless devices 115-125 to travel between areas 105, 106, they must be capable of operating in both modes. As a result, wireless devices 115-125 may include multimode wireless devices. In accordance with the present invention, the multimode wireless device may include a polar modulator including a magnitude filter in the path of the magnitude signal, wherein the magnitude filter may improve a signal quality meeting different communications standards.

In one embodiment, the magnitude filter may be an analog magnitude filter. In this case, a filtering method may include differentiating the magnitude and performing an analog filtering operation to produce a filtered magnitude signal, where the analog filtering operation may include an analog integration.

In another embodiment, the magnitude filter may be a digital magnitude filter. In this case, a filtering method may include upsampling the magnitude signal and performing a digital filtering operation to produce a filtered magnitude signal, where the digital filtering operation may include a digital interpolation operation.

Figure 2:
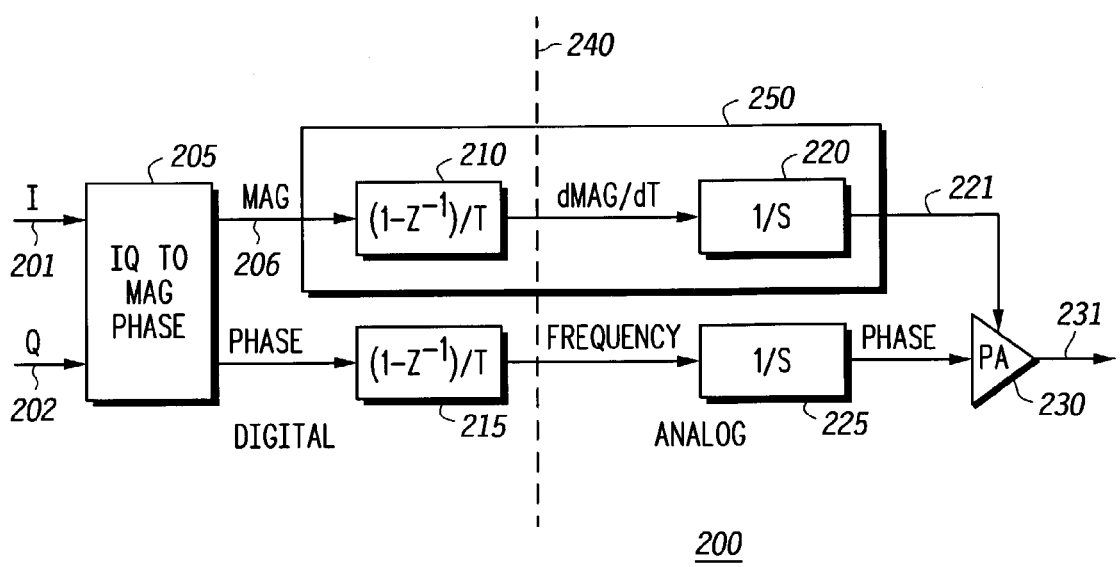
FIG. 2 is a block diagram of a polar modulator with magnitude filter, representing an embodiment of the invention.

Referring to FIG. 2, a block diagram of a polar modulator 200 with magnitude filter is depicted according to an exemplary embodiment of the invention. The modulator 200 may be included in the wireless devices 115-125 detailed in FIG. 1. In one embodiment, a magnitude conditioning block 250 may include an analog magnitude filter 220. In another embodiment, the analog magnitude filter 220 may include an analog integrator.

An in-phase (I) channel 201 and a quadrature-phase (Q) channel 202 are coupled to an I/Q to magnitude/phase block 205. The I/Q to magnitude/phase block 205 provides a magnitude signal 206 to a first digital differentiator block 210 of a magnitude conditioning block 250, and a phase signal to a second digital differentiator block 215. The first and second digital differentiator blocks 210, 215 are coupled to an analog magnitude filter 220 and an analog integrator 225, respectively. The magnitude filter 220 outputs a filtered magnitude signal 221, which controls the gain of a power amplifier 230. The second analog integrator 225 provides a phase signal to the power amplifier 230, and the power amplifier 230 may provide a polar modulated signal 231 to an antenna (not shown).

In operation, the I/Q signals 201, 202 are transformed into magnitude and phase signals by the I/Q to magnitude/phase block 205. The second digital differentiator block 215 transforms a phase signal into a frequency signal, causing a half-sample delay in the phase signal path. Hence, synchronization is accounted for in the magnitude path by the first digital differentiator block 210, causing a half-sample delay in the magnitude signal path. Line 240 represents a boundary indicating a digital-to-analog conversion. The second analog integrator 225 represents an effect of a voltage controlled oscillator (VCO), which integrates the frequency signal back into a phase signal. The analog magnitude filter 220 (analog integrator) may cause an effect in the magnitude signal path similar to that which the VCO causes in the phase signal path, thereby improving an output signal quality.

Figure 3:
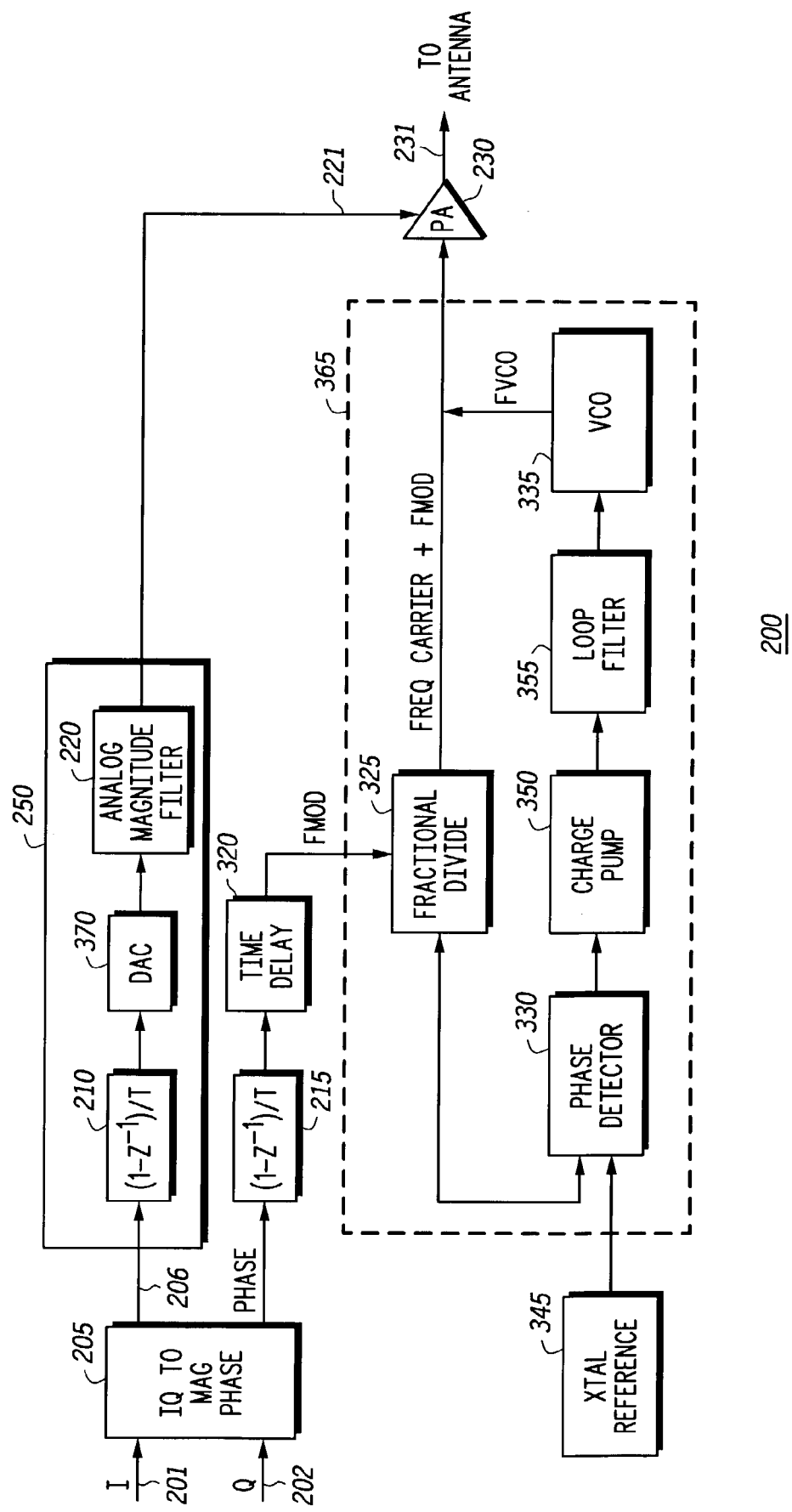
FIG. 3 is a more detailed block diagram of the polar modulator of FIG. 2.

Referring to FIG. 3, a more detailed block diagram of the polar modulator 200 of FIG. 2 is depicted according to an exemplary embodiment of the invention. The I/Q channels 201, 202 are coupled to the I/Q to magnitude/phase circuit 205. The I/Q to magnitude/phase circuit 205 provides the magnitude 206 signal to the first differentiator circuit 210 of the magnitude conditioning block 250, and a phase signal to the second differentiator circuit 215. The first differentiator circuit 210 is coupled to a digital-to-analog converter 370, and the digital-to-analog converter 370 is coupled to an analog magnitude filter circuit 220. The analog magnitude filter circuit 220 provides the filtered magnitude signal 221 to the power amplifier 230.

The second differentiator circuit 215 is coupled to a time delay circuit 320, and the time delay circuit 320 is coupled to a fractional divider circuit 325 of a phase-locked loop (PLL) 365. The fractional divider circuit 325 is coupled to a phase detector circuit 330, a voltage controlled oscillator (VCO) 335, and the power amplifier 340. A crystal reference 345 is also coupled to the phase detector circuit 330. The phase detector circuit 330 is coupled to a charge pump 350, and the charge pump 350 is coupled to a loop filter 355. The loop filter 355 is coupled to the VCO 335, and the VCO 335 is coupled to the power amplifier 340. The power amplifier 340 provides the polar modulated signal 231 to the antenna (not shown).

In operation, I and Q signals 201, 202 are converted into magnitude and phase at baseband by the I/Q to magnitude/phase circuit 205. The magnitude signal is differentiated by the first differentiator circuit 210, converted into an analog signal by the digital-to-analog converter 370, filtered by the analog magnitude filter circuit 220, and used to drive the amplifier 340, thus controlling the amplitude of the polar modulated signal 360. In one embodiment, the analog magnitude filter circuit 220 may be an integrator circuit.

In the phase signal path, the phase signal is converted to a baseband frequency signal (Fmod) by taking the derivative of the phase with the derivative circuit 315. The time delay circuit 320 may be used and/or adjusted to synchronize the phase path with the magnitude path. The baseband frequency signal (Fmod) is then added to the desired carrier frequency (Fcarrier) by the fractional divider circuit 325 and used by the PLL 365 to generate a sinusoidal wave (Fvco). The signal into the fractional divider circuit 325 is converted into a square wave and divided down to the same frequency as the crystal reference 345. When the PLL 365 is locked, the VCO 335 is running at Fvco=Fcarrier+Fmod. The divide ratio of the fractional divider circuit 325 may be such that the frequency output of the fractional divider is equal to the crystal reference 345 frequency.

If the phase of the signal out of the fractional divider circuit 325 is not equal to the phase of the crystal reference 345 signal, the phase detector circuit 330 may determine the phase difference between these two signals. The phase detector circuit 330 provides the charge pump 350 with a signal proportional to the phase difference between its inputs, and the charge pump 350 injects a current into the loop filter 355. The voltage out of the loop filter 355 may change the frequency of oscillation of the VCO 335. Once the VCO 335 frequency is correct, the phase difference is again zero and the PLL 365 is locked.

In order to evaluate the polar modulator 200 of FIGS. 2 and 3, an ideal EDGE 8-PSK signal generated at a 4.33 MHz sample rate was fed into the I/Q channels 201, 202, with the analog section being computed choosing variable time steps. The quality of an EDGE modulated signal was measured by its adjacent channel power ratio (ACPR).

Figure 4:
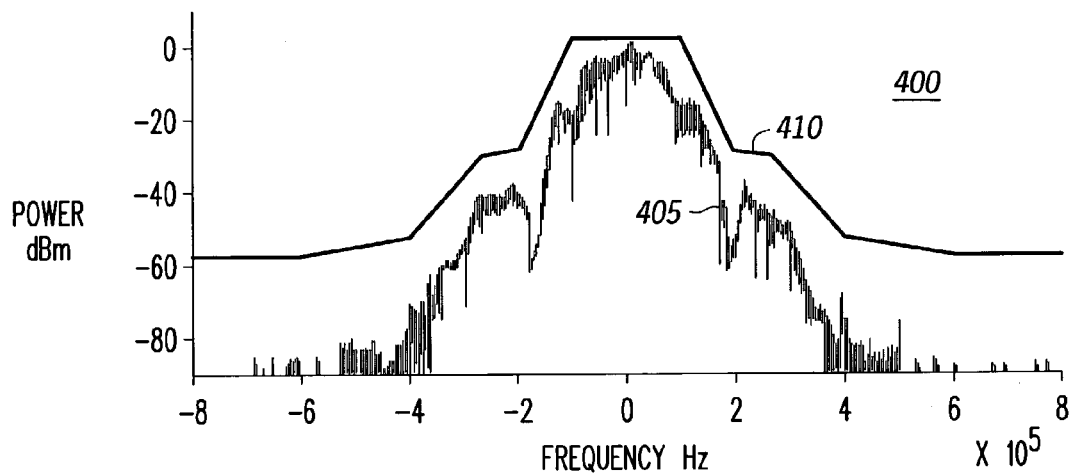
FIGS. 4 and 5 are a set of power graphs of the polar modulator of FIGS. 2 and 3.
Figure 5:
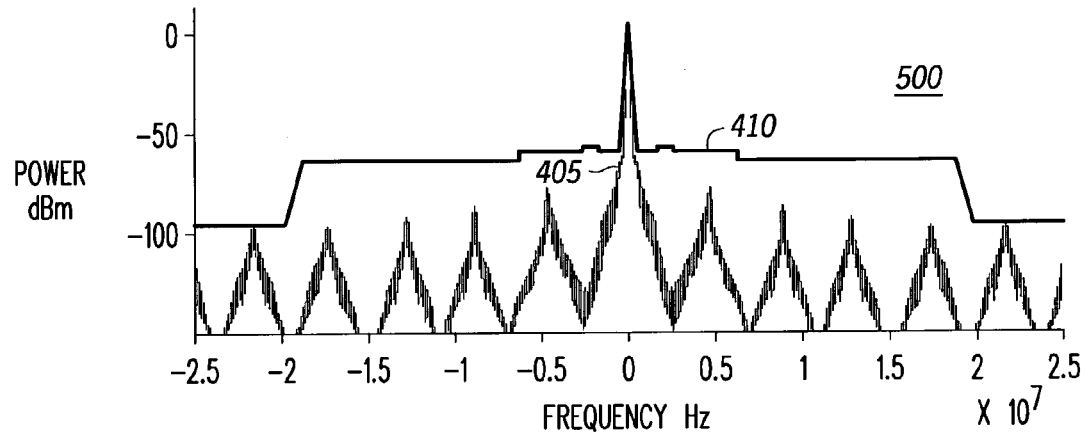

Referring to FIGS. 4 and 5, a set of power graphs of the polar modulator 200 are depicted to illustrate an exemplary embodiment of the invention. The horizontal axes represent frequency (Hz), and the vertical axes represent power (dBm). Graph 400 shows a power spectrum of the EDGE modulated signal at baseband 405 relative to European telecommunications standards institute (ETSI) ACPR specifications 410 around a ±800 KHz bandwidth. Graph 500 shows the power spectrum of the EDGE modulated signal at baseband 405 relative to ETSI ACPR specifications 410 around a ±26 MHz bandwidth. From graphs 400, 500, it may be seen that the polar modulator 200 of FIGS. 2 and 3 satisfactorily meets ACPR specifications.

The invention may include a digital polar modulation system. The invention may also include a digital polar modulator magnitude filter. In one embodiment, the invention includes a method and apparatus for substantially improving a digital signal quality in a polar modulator.

Figure 6:
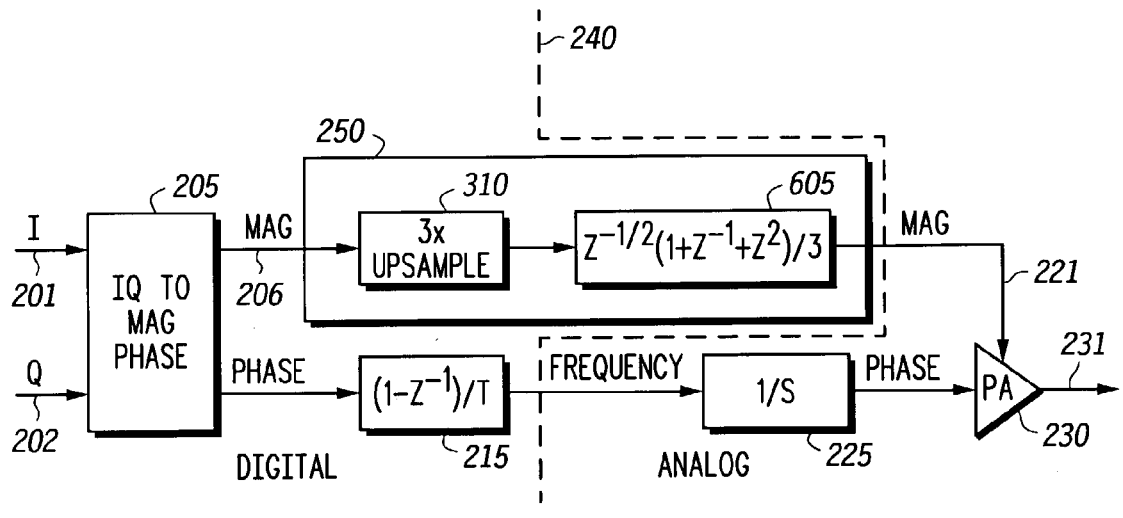
FIG. 6 is a block diagram of another polar modulator with magnitude filter, representing another embodiment of the invention.

Referring to FIG. 6, a block diagram of another polar modulator 600 with magnitude filter, is depicted according to an exemplary embodiment of the invention. The phase signal path is the same as that of FIG. 2. In the magnitude signal path, the I/Q to magnitude/phase block 205 provides the magnitude signal 206 to the upsample block 310 of the magnitude conditioning block 250, and the upsample block 310 is coupled to a digital magnitude filter block 605. The digital magnitude filter block 605 outputs a filtered magnitude signal 221 to control the gain of the amplifier 230.

In one example, the upsample block 310 may provide an upsampling of three times the rate of the original magnitude signal. The digital magnitude filter 605 may implement digital filter such as, for example:

$$z^{-\frac{1}{2}}\frac{(1+z^{-1}+z^{-2})}{3};\qquad \text{Equation 1}$$

where z is a complex variable.

In Equation 1, the $$\frac{(1+z^{-1}+z^{-2})}{3}$$

term computes a moving average of 3 samples, thus performing a digital interpolation operation. The $z^{-1/2}$ term applies a half-sample delay to the magnitude signal path. In one embodiment, the $z^{-1/2}$ term may be performed by a separate block or circuit. As one of ordinary skill in the art will recognize in light of this disclosure, a different delay may be applied to the magnitude signal path.

In another example, the digital magnitude filter 605 term may be designed or programmed as a function of the upsampling rate. For example, if the magnitude signal is upsampled by n times its original rate (n being an integer greater than 1), the magnitude filter may perform digital interpolation of the n most recent points as defined by:

$$\frac{(1+z^{-1}+z^{-2}+\ldots+z^{-n})}{n};\qquad \text{Equation 2}$$

thereby computing a moving average of n samples (magnitude values). In one embodiment, a delay term (for example, $z^{-1/2}$) may multiply Equation 2.

Figure 7:
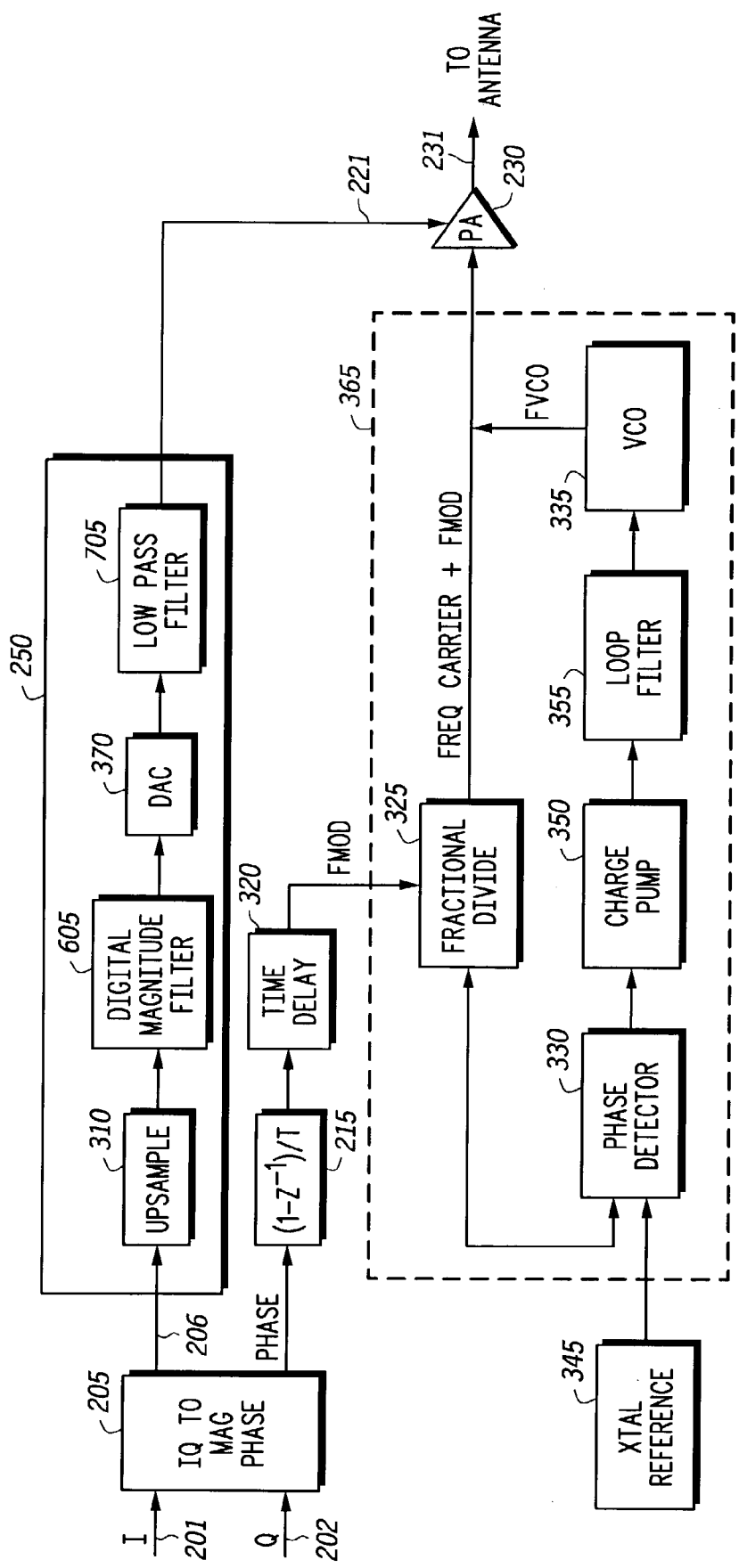
FIG. 7 is a more detailed block diagram of the polar modulator of FIG. 6.

Referring to FIG. 7, a more detailed block diagram of the polar modulator 600 of FIG. 6 is depicted according to an exemplary embodiment of the invention. The blocks in the phase signal path are identical to those of FIG. 3. In the magnitude signal path, an upsample circuit 310 is coupled to the digital magnitude filter circuit 605, and the digital magnitude filter circuit 605 is coupled to the digital-to-analog converter circuit 370. The digital-to-analog converter circuit 370 is coupled to the power amplifier 230 through a low pass filter 705.

In practice, the digital magnitude filter 605 may be implemented as an integrated circuit (IC), and may be a part of a polar modulator integrated circuit. In another embodiment, the digital magnitude filter 605 may be implemented as programmable circuit such as, for example, a programmable gate array, a microprocessor, or digital signal processor-based circuit. In operation, the digital magnitude filter 605 may provide a significant improvement in signal quality.

In order to evaluate the polar modulator 600 of FIGS. 6 and 7, the same ideal EDGE 8-PSK signal used to evaluate the polar modulator 200 of FIGS. 2 and 3 was used.

Figure 8:
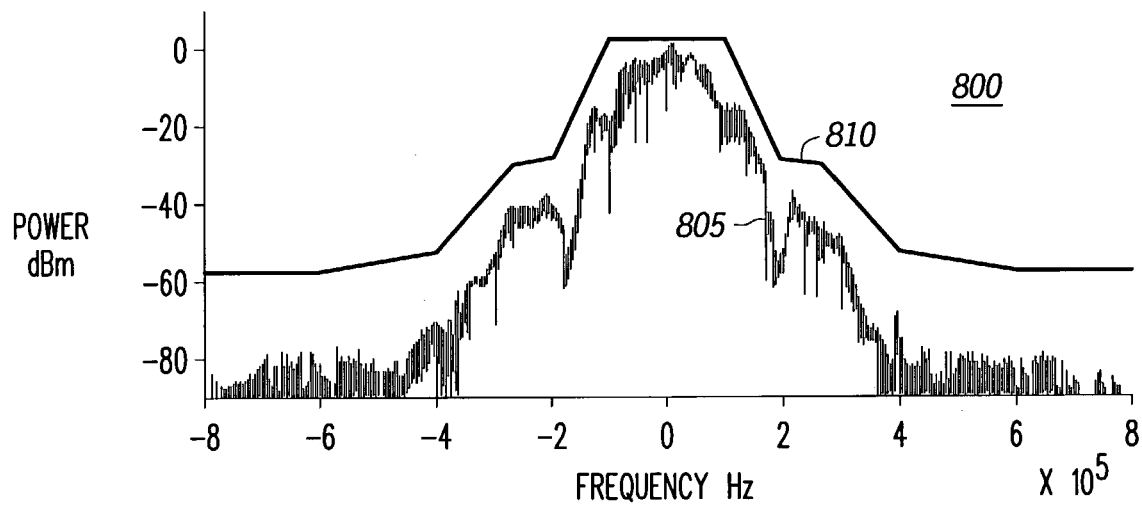
FIGS. 8 and 9 are a set of power graphs of the polar modulator of FIGS. 6 and 7.
Figure 9:
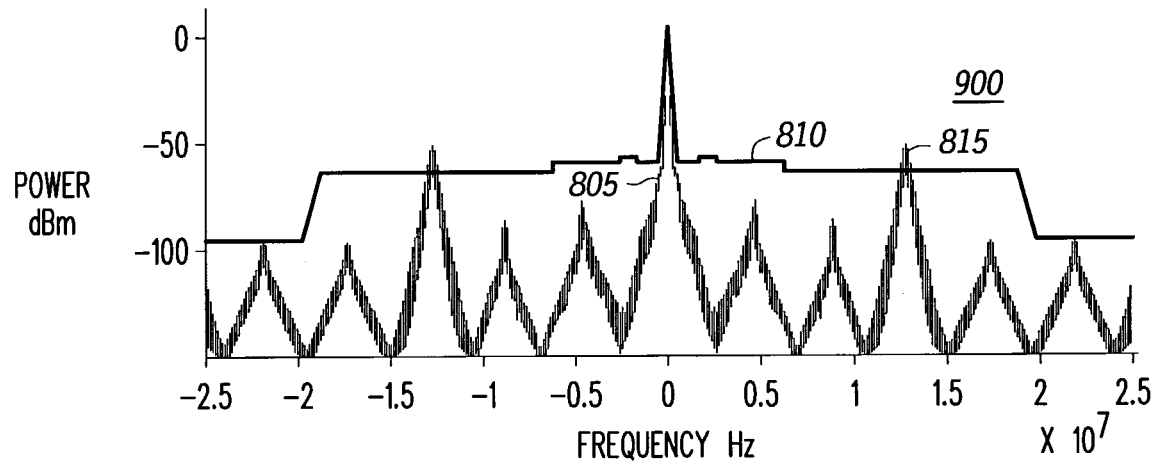

Referring to FIGS. 8 and 9, are a set of power graphs of the polar modulator of FIGS. 6 and 7 are depicted to illustrate an exemplary embodiment of the invention. The horizontal axes represent frequency (Hz), and the vertical axes represent power (dBm). Graph 800 shows a power spectrum of the EDGE modulated signal at baseband 805 relative to ETSI ACPR specifications 810 around a ±800 KHz bandwidth. Graph 900 shows the power spectrum of the EDGE modulated signal at baseband 805 relative to ETSI ACPR specifications 810 around a ±26 MHz bandwidth.

From graphs 800, 900, it may be seen that polar modulator 600 of FIGS. 6 and 7 meets ACPR specifications within a ±13 MHz bandwidth. Further, graph 900 shows the images at multiples of 4.33 MHz with a margin of approximately ~15 dB to specifications at 400 KHz. In practice, because the third sideband 815 is out-of-specifications (due to the third order upsampling), another magnitude filter may be used to filter out the signal 805 at the corresponding frequency 815. In another embodiment of the invention, a higher upsampling rate (and corresponding order of interpolation of the magnitude filter) may move the out-of-specification image farther away from the origin.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term approximately, as used herein, is defined as at least close to a given value (e.g., preferably within 10% of, more preferably within 1% of, and most preferably within 0.1% of). The term substantially, as used herein, is defined as at least approaching a given state (e.g., preferably within 10% of, more preferably within 1% of, and most preferably within 0.1% of).

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method, comprising:
providing an in-phase signal and a quadrature-phase signal;
processing the in-phase and quadrature phase signals to produce a magnitude signal and a phase signal;
differentiating the phase signal to produce a frequency signal;
integrating the frequency signal to produce a conditioned phase signal;
filtering the magnitude signal to produce a filtered magnitude signal; and
amplifying the conditioned phase signal as a function of the filtered magnitude signal to produce a polar modulated signal.

2. The method of claim 1, wherein filtering the magnitude signal includes differentiating the magnitude signal to produce a differentiated magnitude signal.

3. The method of claim 2, further comprising performing an analog filtering operation on the differentiated magnitude signal to produce the filtered magnitude signal.

4. The method of claim 3, wherein performing the analog filtering operation comprises performing an analog integration.

5. The method of claim 1, wherein filtering the magnitude signal includes upsampling the magnitude signal to produce an upsampled magnitude signal.

6. The method of claim 5, further comprising performing a digital filtering operation on the upsampled magnitude signal to produce the filtered magnitude signal.

7. The method of claim 6, wherein performing the digital filtering operation comprises performing a digital interpolation operation.

8. The method of claim 7, wherein performing the digital interpolation operation comprises averaging a set of magnitude values.

9. The method of claim 7, wherein performing the digital interpolation operation comprises performing a digital interpolation as a function of an upsampling rate.

10. The method of claim 7, wherein performing a digital interpolation operation comprises performing a delay operation.

11. The method of claim 10, wherein performing the delay operation comprises performing a half-sample delay operation.

12. The method of claim 7, wherein performing the digital interpolation operation comprises performing an operation defined by:

$$\frac{(1 + z^{-1} + z^{-2} + \ldots + z^{-n})}{n},$$

where:
z is a complex variable and n is an integer greater than 1.

13. The method of claim 1, further comprising transmitting the polar modulated signal to a receiver.

14. A method, comprising:
providing an in-phase signal and a quadrature-phase signal;
processing the in-phase and quadrature phase signals to produce a magnitude signal and a phase signal;
differentiating the phase signal to produce a frequency signal;
integrating the frequency signal to produce a conditioned phase signal;
upsampling the magnitude signal to produce an upsampled magnitude signal;
filtering the upsampled magnitude signal to produce a filtered magnitude signal;
digital-to-analog converting the filtered magnitude signal to produce an analog magnitude signal;
low-pass filtering the analog magnitude signal to produce a low-pass filtered magnitude signal; and
amplifying the conditioned phase signal as a function of the low-pass filtered magnitude signal to produce a polar modulated signal.

15. The method of claim 14, wherein filtering the upsampled magnitude signal comprises performing a digital interpolation operation.

16. The method of claim 15, wherein performing the digital interpolation operation comprises averaging a set of magnitude values.

17. The method of claim 15, wherein performing the digital interpolation operation comprises performing a digital interpolation as a function of an upsampling rate.

18. The method of claim 17, wherein performing the delay operation comprises performing a half-sample delay operation.

19. The method of claim 15, wherein performing a digital interpolation operation comprises performing a delay operation.

20. The method of claim 15, wherein performing the digital interpolation operation comprises performing a digital operation defined by:

$$\frac{(1 + z^{-1} + z^{-2} + \ldots + z^{-n})}{n},$$

where:
z is a complex variable and n is an integer greater than 1.

21. The method of claim 14, further comprising transmitting the polar modulated signal.

22. A polar modulator, comprising:
a pair of I/Q channels;
an I/Q to magnitude/phase circuit coupled to the pair of I/Q channels;
a magnitude conditioning circuit coupled to the I/Q to magnitude/phase circuit, the magnitude conditioning circuit embodying a magnitude filter;
a phase conditioning circuit coupled to the I/Q to magnitude/phase circuit, the phase conditioning circuit embodying a differentiator and an integrator; and
an amplifier circuit coupled to the magnitude conditioning circuit and the phase conditioning circuit.

23. The polar modulator of claim 22, wherein the magnitude filter comprises an analog integrator.

24. The polar modulator of claim 22, wherein the magnitude filter comprises a digital interpolator, the digital interpolator performing an operation defined by:

$$\frac{(1 + z^{-1} + z^{-2} + \ldots + z^{-n})}{n},$$

where:
z is a complex variable and n is an integer greater than 1.

25. The polar modulator of claim 22, the amplifier circuit comprising a non-linear power amplifier.

* * * * *